United States Patent
Miyata et al.

(10) Patent No.: US 8,621,316 B2
(45) Date of Patent: Dec. 31, 2013

(54) METHOD AND DEVICE FOR ENCODING OF ERROR CORRECTING CODES, AND METHOD AND DEVICE FOR DECODING OF ERROR CORRECTING CODES

(75) Inventors: Yoshikuni Miyata, Tokyo (JP); Hideo Yoshida, Tokyo (JP); Kazuo Kubo, Tokyo (JP); Takashi Mizuochi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 198 days.

(21) Appl. No.: 12/987,368

(22) Filed: Jan. 10, 2011

(65) Prior Publication Data

US 2011/0173511 A1 Jul. 14, 2011

(30) Foreign Application Priority Data

Jan. 14, 2010 (JP) ................................. 2010-006142

(51) Int. Cl.
*G06F 11/00* (2006.01)
*H03M 13/00* (2006.01)

(52) U.S. Cl.
USPC ........................... 714/755; 714/701; 714/758

(58) Field of Classification Search
None
See application file for complete search history.

(56) References Cited

U.S. PATENT DOCUMENTS

| | | | |
|---|---|---|---|
| 6,282,686 B1 * | 8/2001 | Cypher | 714/758 |
| 6,393,597 B1 * | 5/2002 | Cypher | 714/785 |
| 6,453,440 B1 * | 9/2002 | Cypher | 714/758 |
| 7,191,378 B2 * | 3/2007 | Eroz et al. | 714/758 |
| 7,289,530 B1 | 10/2007 | Yuan et al. | |
| 7,826,556 B2 * | 11/2010 | Ghosh et al. | 375/299 |
| 8,402,339 B2 * | 3/2013 | Kubo et al. | 714/752 |
| 2004/0117711 A1 * | 6/2004 | Farbert et al. | 714/755 |
| 2005/0024762 A1 * | 2/2005 | Osafune et al. | 360/77.04 |
| 2005/0149820 A1 * | 7/2005 | Gastaldello et al. | 714/758 |
| 2008/0092009 A1 | 4/2008 | Miyata et al. | |
| 2008/0148127 A1 | 6/2008 | Miyata et al. | |
| 2010/0332944 A1 * | 12/2010 | Cypher et al. | 714/763 |

FOREIGN PATENT DOCUMENTS

| | | |
|---|---|---|
| EP | 1 401 107 A1 | 3/2004 |
| EP | 1 545 011 A1 | 6/2005 |
| JP | 4382124 | 10/2009 |
| WO | WO 2006/085488 A1 | 8/2006 |

OTHER PUBLICATIONS

Extended European Search Report issued Oct. 11, 2012 in Patent Application No. 10016036.5.
Yoshikuni Miyata, et al. "Proposal for Frame Structure of Optical Channel Transport Unit Employing LDPC codes for 100 Gb/s FEC", Optical Fiber Communication, XP031467599A, Mar. 22, 2009, 3 pages.

(Continued)

*Primary Examiner* — Daniel McMahon
(74) *Attorney, Agent, or Firm* — Oblon, Spivak, McClelland, Maier & Neustadt, L.L.P.

(57) ABSTRACT

An error correction encoding device includes an outer encoding circuit that performs encoding processing for an outer code and an inner encoding circuit that performs encoding processing for an inner code. The inner encoding circuit includes an inner-encoding input circuit that performs interleaving processing in which a parallel input sequence is divided into lanes and in which a barrel shift is performed for each inner frame in the lanes. Thus, allocation ratios between an information sequence area and a parity sequence area are made uniform.

10 Claims, 13 Drawing Sheets

(56) References Cited

OTHER PUBLICATIONS

"Interfaces for the Optical Transport Network (OTN)", Series G: Transmission Systems and Media, Digital Systems and Networks, Digital terminal equipments—General; Series Y: Global Information Infrastructure, Internet Protocol Aspects and Next Generation Networks, Internet protocol aspects—Transport, International Telecommunication Union, G. 709/Y. 1331, Mar. 2003, 117 pages.

Office Action issued Jul. 17, 2013, in European patent Application No. 10 016 036.5.

Chongfu Zhang, et al., Comparisons Between Different Concatenated Codes Impact on Performance of Optical CDMA, IEEE XP32212574A, Jul. 11, 2007, pp. 525-529.

Office Action issued in Japanese Patent Application No. 2010-006142 on Sep. 3, 2013 (with English translation).

Yoshikuni Miyata et al., "A Study on LDPC Codes for Optical Communications using Concatenation to Combat Error-floor," Transactions of General Conference 2008 of the Institute of Electronics, Information and Communication Engineers, Communication 2, Mar. 5, 2008, B-10-92.

\* cited by examiner

METHOD AND DEVICE FOR ENCODING OF ERROR CORRECTING CODES, AND METHOD AND DEVICE FOR DECODING OF ERROR CORRECTING CODES

BACKGROUND OF THE INVENTION

1. Field of the Invention

The present invention relates to an error correction encoding method, an error correction decoding method, and devices therefor, which are used in a digital transmission system, for example.

2. Description of the Related Art

For example, in a conventional error correction encoding method for optical communications (see Japanese Patent No. 4382124), as illustrated in FIGS. 2, 5, 6, and 7 of Japanese Patent No. 4382124, a function of carrying out interleaving between outer code and inner code is implemented through an operation of performing a bit shift on a column basis. In this case, the interleaving operation may be performed through parallel processing of 128 lines per column with respect to an optical channel transport unit-k (OTUk) frame (k is classified into four categories of 1, 2, 3, and 4, depending on the transmission speed), which is compliant with ITU-T Recommendation G.709 (see ITU-T Recommendation G.709). In this case, allocation ratios between an information sequence area and a parity sequence area, which are provided in each of four inner frames (here, referred to as forward error correction (FEC) frames), are uniform among all the 128 lines.

Due to the fact that the conventional error correction encoding method and devices therefor are configured as described above, in a case of performing parallel processing of 512 lines per column and adopting an OTUkV frame described in Appendix of ITU-T Recommendation G.709 (a parity sequence length is lengthened compared to the OTUk frame), the parity sequence length of each inner frame needs to be divisible by 512. When this condition is not satisfied, the allocation ratios between the information sequence area and the parity sequence area become non-uniform among the lines, and hence distribution in a codeword sequence arranged in a lateral direction becomes non-uniform.

As described above, the conventional error correction encoding method and the devices therefor have a problem in that a constraint is imposed on the parity sequence length. In other words, there is a problem in that a constraint is imposed on a frame structure for improving, through an increased parallel number for processing, a processing throughput and for enhancing an error correction capability.

SUMMARY OF THE INVENTION

The present invention has been made in order to solve the above-mentioned problem, and therefore has an object to provide an error correction encoding method, an error correction decoding method, an error correction encoding device, and an error correction decoding device, which are capable of making uniform allocation ratios between an information sequence area and a parity sequence area by carrying out interleaving, in which a parallel input sequence is divided into given lanes, and a given barrel shift is performed for each inner frame, to thereby improve a processing throughput and enhance an error correction capability.

According to the present invention, there is provided an error correction encoding method including: an outer encoding step of performing encoding processing for outer code; an inner encoding step of performing encoding processing for inner code; and an interleaving processing step of dividing a parallel input sequence into given lanes, and performing a given barrel shift for each inner frame.

According to the present invention, the error correction encoding method includes: the outer encoding step of performing the encoding processing for outer code; the inner encoding step of performing the encoding processing for inner code; and the interleaving processing step of dividing the parallel input sequence into the given lanes, and performing the given barrel shift for the each inner frame. Thus, by carrying out the interleaving in which the parallel input sequence is divided into the given lanes, and the given barrel shift is performed for the each inner frame, the allocation ratios between the information sequence area and the parity sequence area can be made uniform, and it is possible to realize the error correction encoding method for improving the processing throughput and enhancing the error correction capability through avoiding a constraint imposed on the frame structure.

BRIEF DESCRIPTION OF THE DRAWINGS

In the accompanying drawings:

FIG. 11 is an explanatory diagram illustrating a frame format used in the error correction encoding method according to the first embodiment of the present invention;

FIG. 12 is an explanatory diagram illustrating a frame format used in the error correction encoding method according to the first embodiment of the present invention;

FIG. 13 is an explanatory diagram illustrating a frame format used in the error correction encoding method according to the first embodiment of the present invention; and FIG. 14 is an explanatory diagram illustrating a frame format used in the error correction encoding method according to the first embodiment of the present invention.

DETAILED DESCRIPTION OF THE PREFERRED EMBODIMENT

First Embodiment

Figure 5:
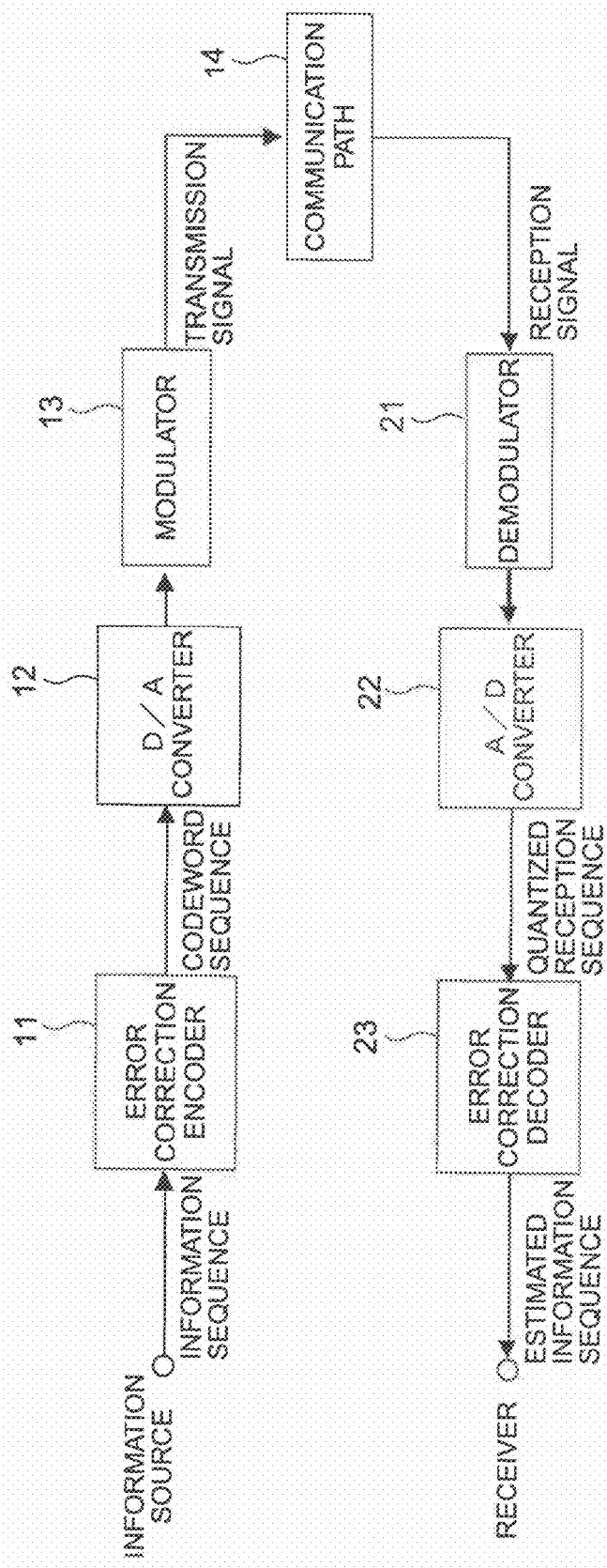
FIG. 5 is a block diagram illustrating a configuration of a digital transmission system according to the first embodiment of the present invention.

FIG. 5 is a block diagram illustrating a configuration of a digital transmission system (hereinafter, simply referred to as "transmission system") including an error correction encoding device and an error correction decoding device according to an embodiment of the present invention. In FIG. 5, the transmission system includes error correction encoder 11 (error correction encoding device) connected to an information source, digital/analog (D/A) converter 12 connected to the error correction encoder 11, modulator 13 connected to the D/A converter 12, communication channel 14 connected to the modulator 13, demodulator 21 connected to the modulator 13 via the communication channel 14, analog/digital (A/D) converter 22 connected to the demodulator 21, and error correction decoder 23 (error correction decoding device) connected to the A/D converter 22. The error correction decoder 23 is connected to a receiver side. Here, the D/A converter 12, the modulator 13, the communication channel 14, the demodulator 21, and the A/D converter 22 have device configurations commonly used in digital transmission systems. It should be noted that the D/A converter 12 is necessary in the case of multi-level modulation, which deals with a level higher than binary, but is not always necessary in the case of binary modulation.

Figure 1:
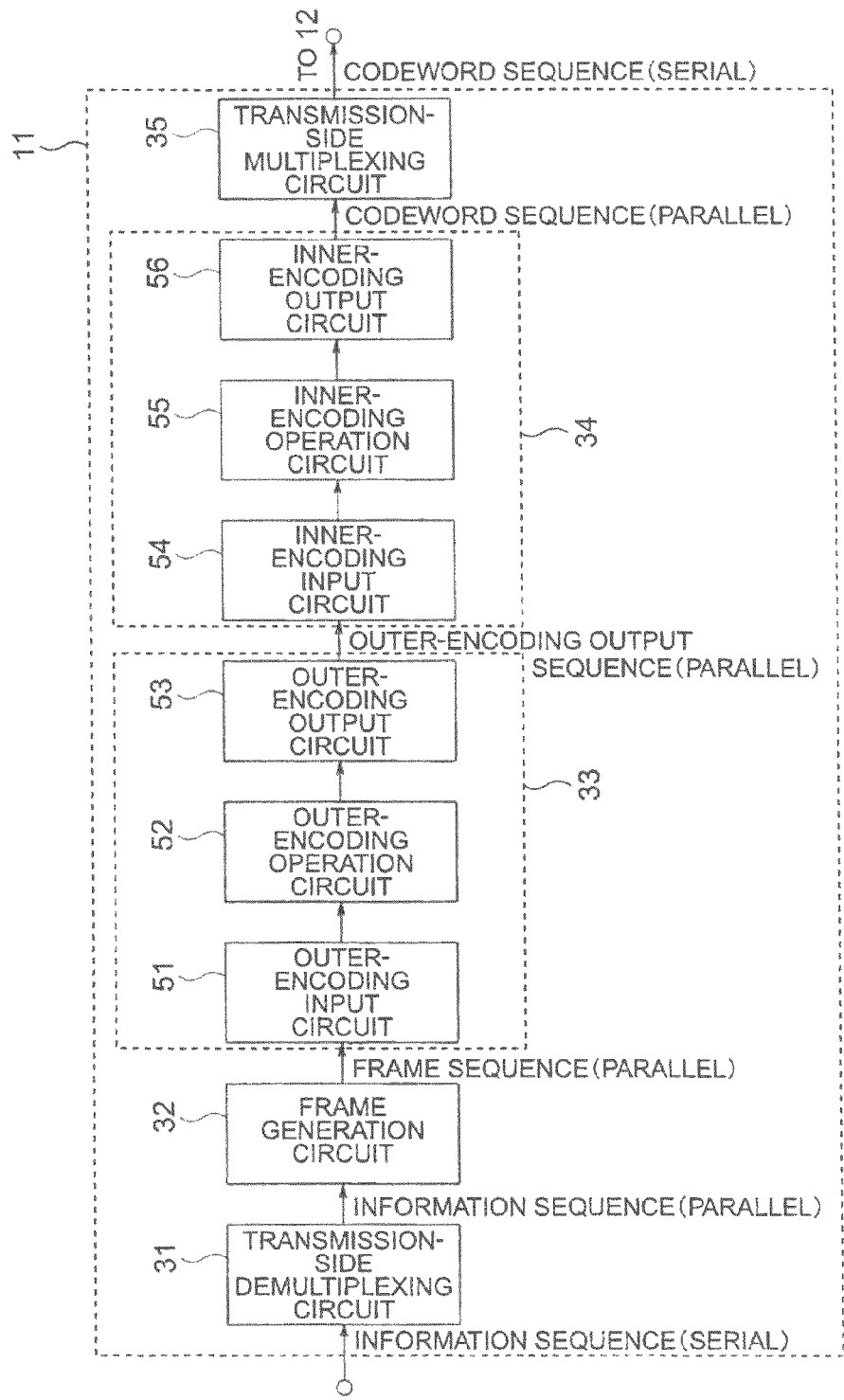
FIG. 1 is an explanatory diagram illustrating an error correction encoding method and a circuit configuration of a device therefor according to a first embodiment of the present invention.

FIG. 1 is a block diagram illustrating a specific configuration example of the error correction encoder 11 of FIG. 5. In FIG. 1, the error correction encoder 11 includes transmission-side demultiplexing circuit 31, frame generation circuit 32, outer-encoding input circuit 51, outer-encoding operation circuit 52, outer-encoding output circuit 53, inner-encoding input circuit 54, inner-encoding operation circuit 55, inner-encoding output circuit 56, and transmission-side multiplexing circuit 35. It should be noted that the outer-encoding input circuit 51, the outer-encoding operation circuit 52, and the outer-encoding output circuit 53 constitute outer encoding circuit 33 (encoding means for outer code), and also that the inner-encoding input circuit 54, the inner-encoding operation circuit 55, and the inner-encoding output circuit 56 constitute inner encoding circuit 34 (encoding means for inner code).

Figure 3:
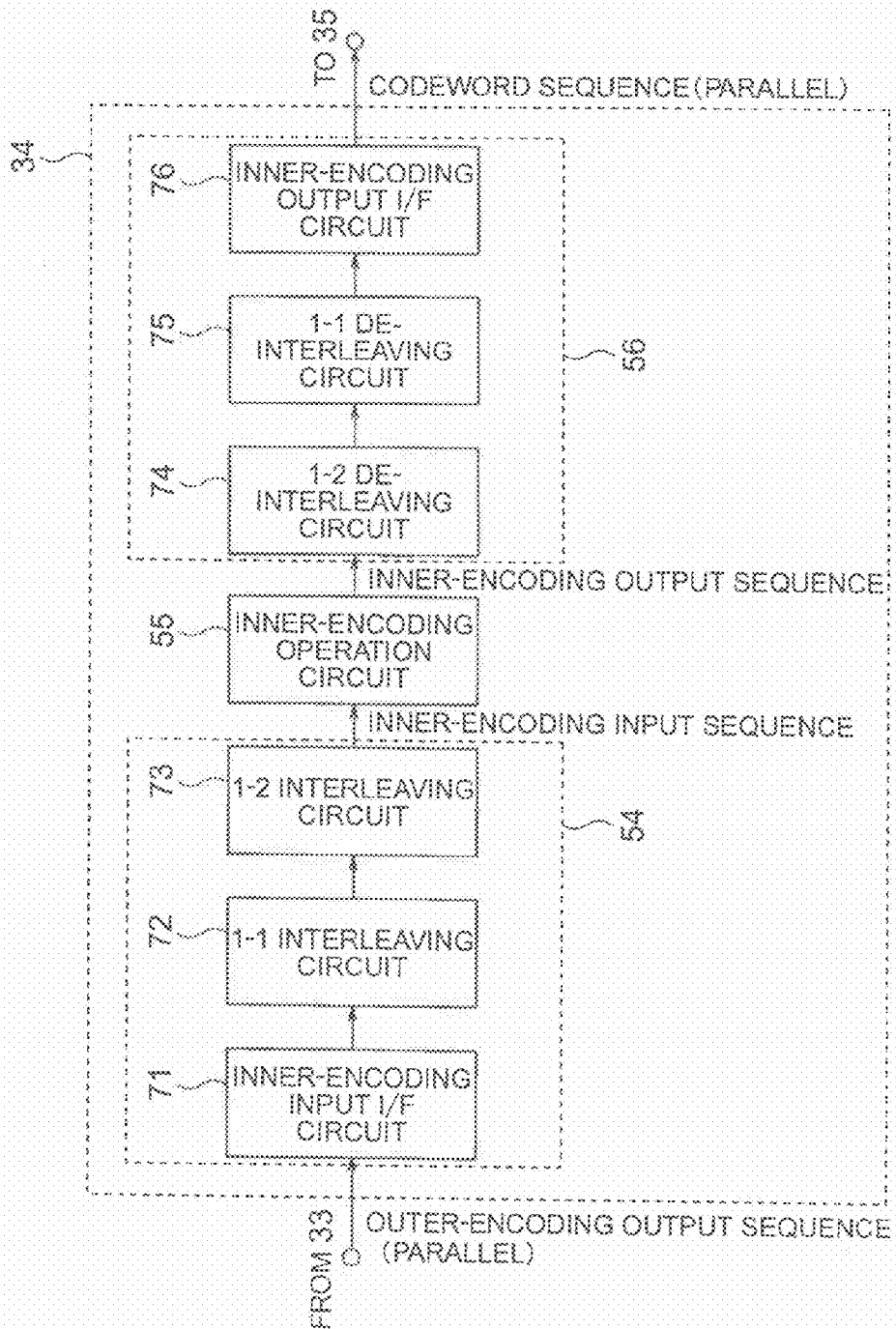
FIG. 3 is an explanatory diagram illustrating the error correction encoding method and a circuit configuration of a device therefor according to the first embodiment of the present invention.

FIG. 3 is a block diagram illustrating a specific configuration example of the inner encoding circuit 34 of FIG. 1. In FIG. 3, the inner encoding circuit 34 includes inner-encoding input interface (I/F) circuit 71, 1-1 interleaving circuit 72, 1-2 interleaving circuit 73, the inner-encoding operation circuit 55, 1-2 de-interleaving circuit 74, 1-1 de-interleaving circuit 75, and inner-encoding output I/F circuit 76. It should be noted that the inner-encoding input I/F circuit 71, the 1-1 interleaving circuit 72, and the 1-2 interleaving circuit 73 constitute the inner-encoding input circuit 54, and also that the 1-2 de-interleaving circuit 74, the 1-1 de-interleaving circuit 75, and the inner-encoding output I/F circuit 76 constitute the inner-encoding output circuit 56.

Figure 2:
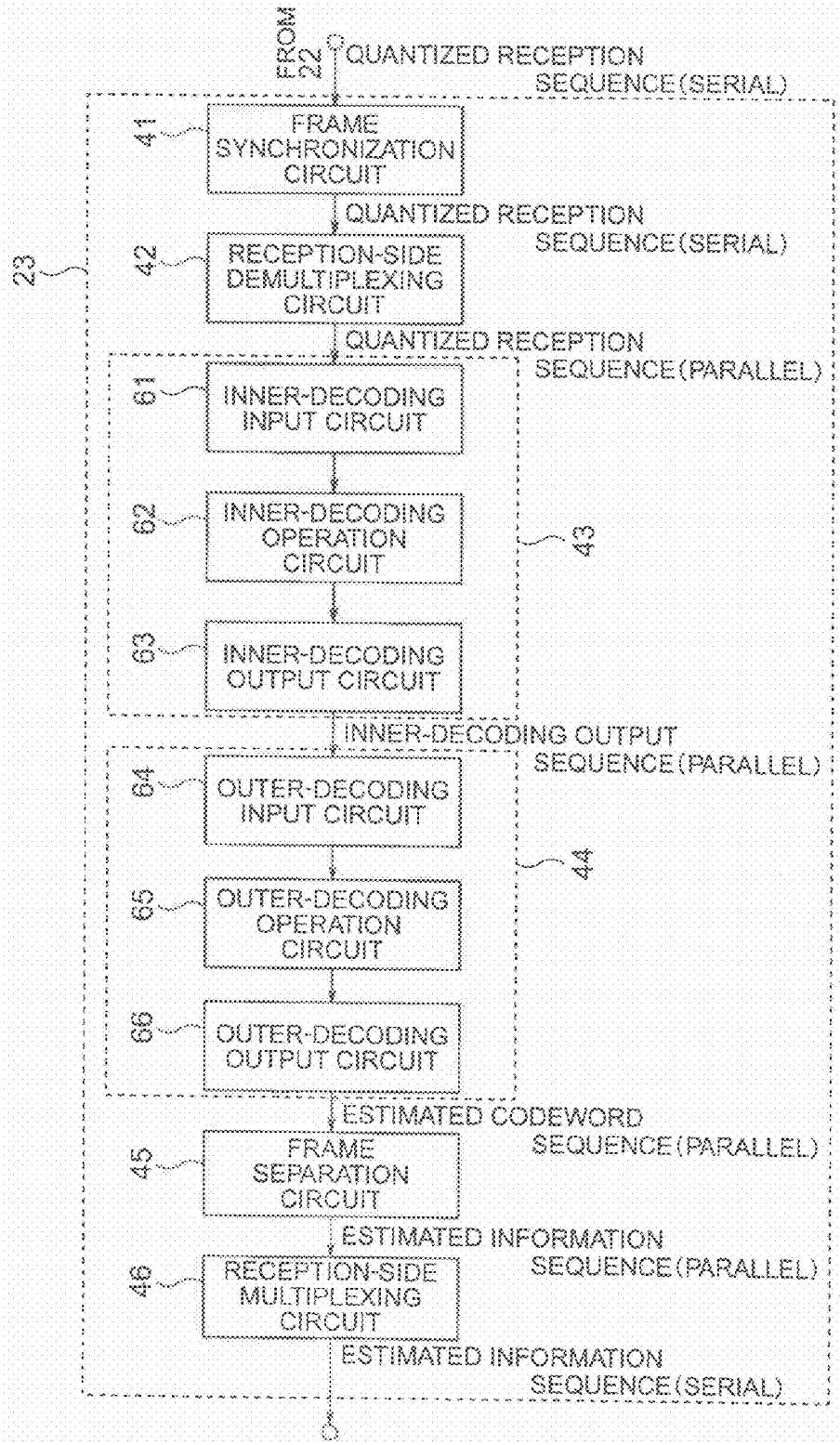
FIG. 2 is an explanatory diagram illustrating an error correction decoding method and a circuit configuration of a device therefor according to the first embodiment of the present invention.

FIG. 2 is a block diagram illustrating a specific configuration example of the error correction decoder 23 of FIG. 5. In FIG. 2, the error correction decoder 23 includes frame synchronization circuit 41, reception-side demultiplexing circuit 42, inner-decoding input circuit 61, inner-decoding operation circuit 62, inner-decoding output circuit 63, outer-decoding input circuit 64, outer-decoding operation circuit 65, outer-decoding output circuit 66, frame separation circuit 45, and reception-side multiplexing circuit 46. It should be noted that the inner-decoding input circuit 61, the inner-decoding operation circuit 62, and the inner-decoding output circuit 63 constitute inner decoding circuit 43 (decoding means for inner code), and also that the outer-decoding input circuit 64, the outer-decoding operation circuit 65, and the outer-decoding output circuit 66 constitute outer decoding circuit 44 (decoding means for outer code).

Figure 4:
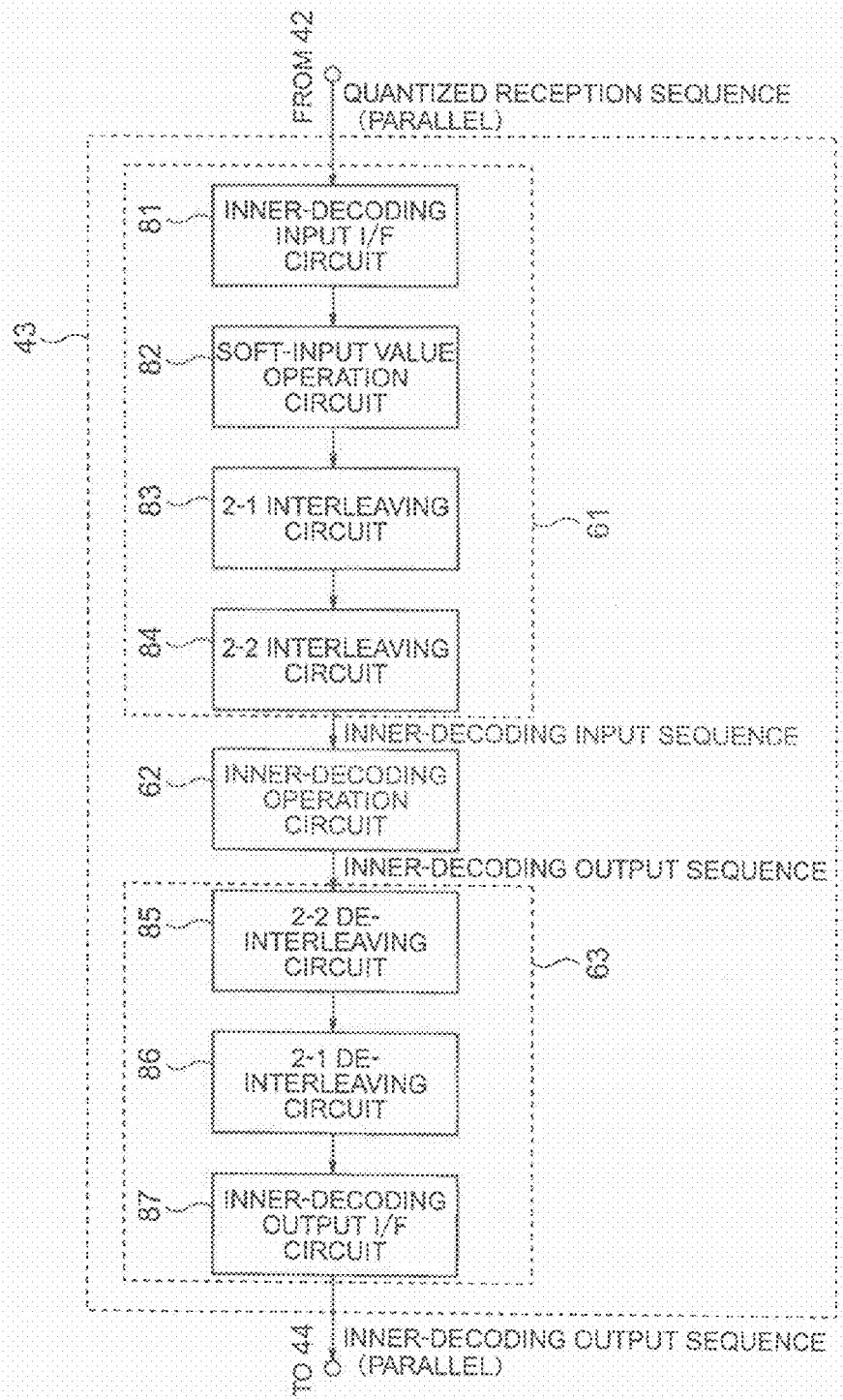
FIG. 4 is an explanatory diagram illustrating the error correction decoding method and a circuit configuration of a device therefor according to the first embodiment of the present invention.

FIG. 4 is a block diagram illustrating a specific configuration example of the inner decoding circuit 43 of FIG. 2. In FIG. 4, the inner decoding circuit 43 includes inner-decoding input I/F circuit 81, soft-input value operation circuit 82, 2-1 interleaving circuit 83, 2-2 interleaving circuit 84, the inner-decoding operation circuit 62, 2-2 de-interleaving circuit 85, 2-1 de-interleaving circuit 86, and inner-decoding output I/F circuit 87. It should be noted that the inner-decoding input I/F circuit 81, the soft-input value operation circuit 82, the 2-1 interleaving circuit 83, and the 2-2 interleaving circuit 84 constitute the inner-decoding input circuit 61, and also that the 2-2 de-interleaving circuit 85, the 2-1 de-interleaving circuit 86, and the inner-decoding output I/F circuit 87 constitute the inner-decoding output circuit 63.

It should be noted that detailed diagrams of the outer encoding circuit 33 and the outer decoding circuit 44 illustrated in FIG. 1 and FIG. 2, respectively, are omitted herein for the following reason. That is, when description is given of a function of carrying out interleaving in which a parallel input sequence is divided into given lanes, and a given barrel shift is performed for each inner frame, which is a feature of a first embodiment of the present invention, it is preferred to use a case of implementing the function on the sides of the inner encoding circuit 34 and the inner decoding circuit 43. It should be noted that, according to the first embodiment of the present invention, it is also possible to implement the function on the sides of the outer encoding circuit 33 and the outer decoding circuit 44 if frame format conditions are adjusted.

Next, description is given of operation of the error correction encoder 11. In FIG. 1, first, an information sequence, which is input to the error correction encoder 11 in serial order or in compliance with a predetermined interface standard, such as Serdes Framer Interface (SFI), is converted into an information sequence in parallel order by the transmission-side demultiplexing circuit 31. A parallel number in this case is defined as "n". The parallel number n may be defined with an arbitrary integer according to the predetermined frame format. However, in the first embodiment of the present invention, description is given by assuming that n=512 in consideration of a case of using a frame compliant with an optical channel transport unit-k (OTUkV) frame. The information sequence in parallel order, which is obtained through the conversion by the transmission-side demultiplexing circuit 31, is converted into a sequence in predetermined frame order by the frame generation circuit 32.

Figure 6:
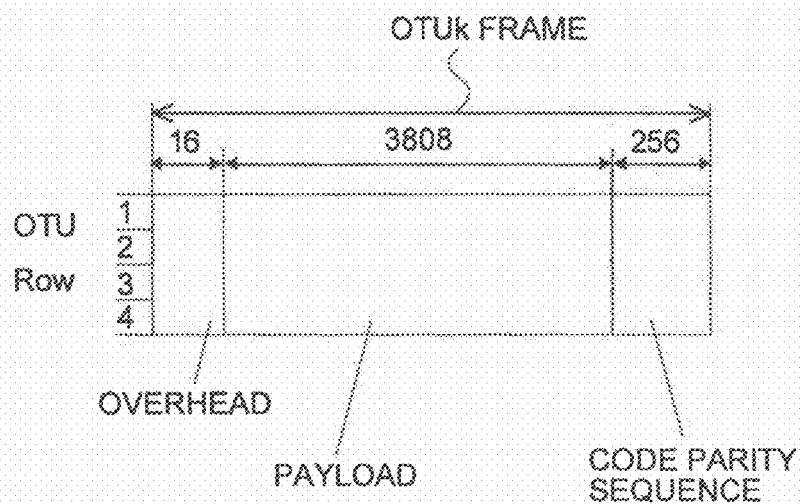
FIG. 6 is an explanatory diagram illustrating a standard frame format used in an error correction encoding method.
Figure 7:
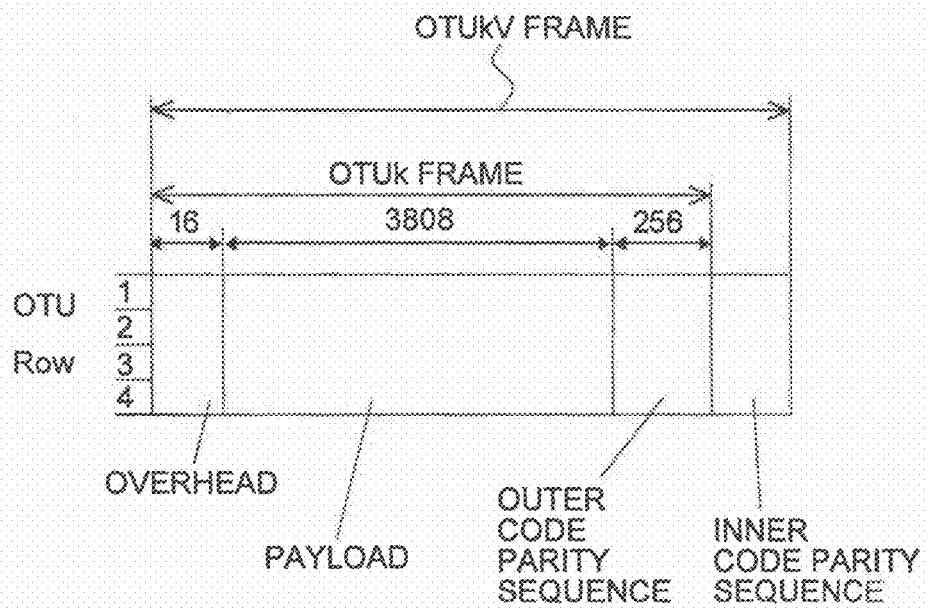
FIG. 7 is an explanatory diagram illustrating a frame format used in the error correction encoding method according to the first embodiment of the present invention.
Figure 8:
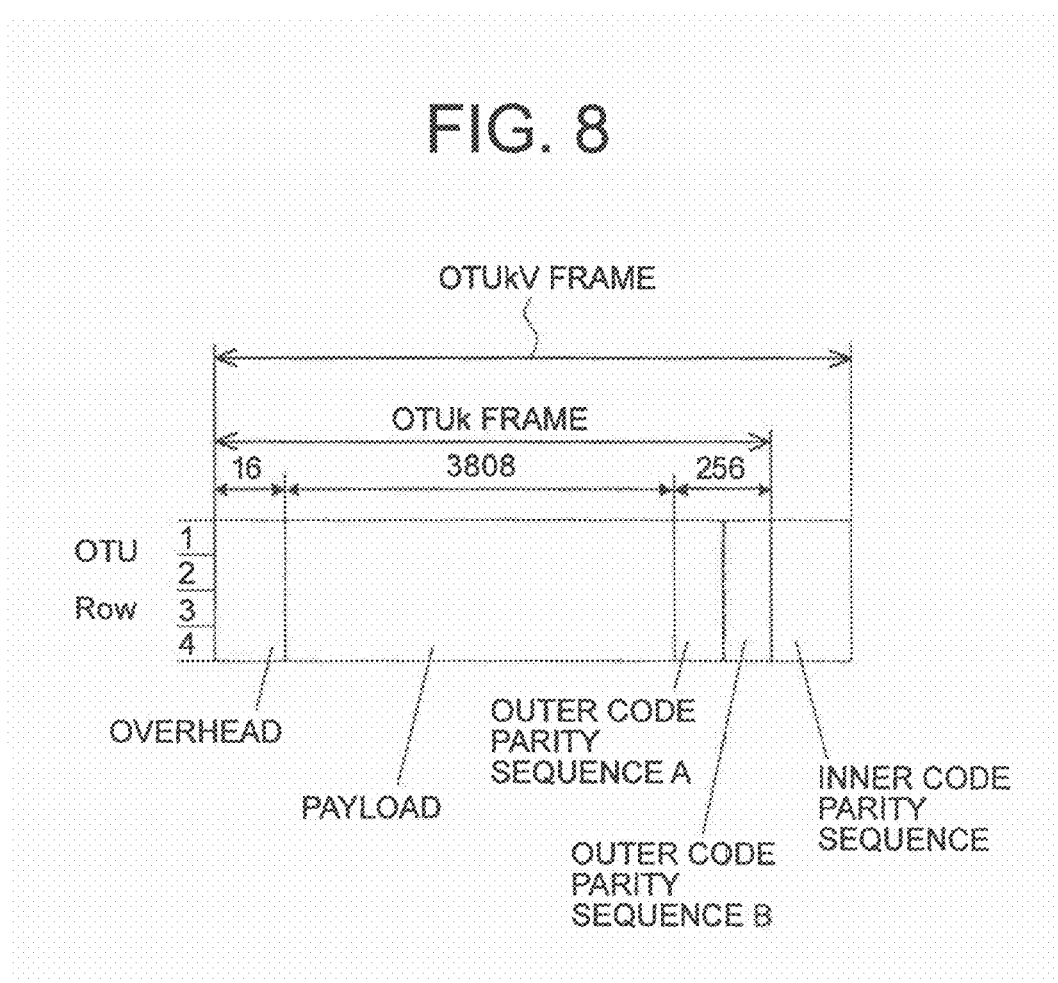
FIG. 8 is an explanatory diagram illustrating a frame format used in the error correction encoding method according to the first embodiment of the present invention.

For example, in the case of an OTUk frame compliant with ITU-T Recommendation G.709 (see ITU-T Recommendation G.709), which is commonly used in optical communications, a frame format is as illustrated in FIG. 6. FIG. 6 illustrates an image view of an OTUk frame. In this example, there are provided OTU Row 1, Row 2, Row 3, and Row 4, and each of the Rows 1 to 4 is sectioned into areas of overhead (OH) signal for control (which has a length of 1×16 bytes for each Row), payload corresponding to an information sequence (which has a length of 238×16 bytes for each Row), and code parity sequence (which has a length of 16×16 bytes for each Row). Further, in the case of an OTUkV frame described in Appendix of ITU-T Recommendation G.709, a frame format is as illustrated in FIG. 7. In FIG. 7, an OH and a payload have the same lengths as the OH and the payload of the OTUk frame, respectively. The length of a parity sequence is made arbitrarily longer compared to the case of the OTUk frame, and the lengthened part is allocated to an inner code parity sequence. Further, in a case of using a concatenated code, a product code, or the like compliant with the OTUk frame, such as a code described in Appendix of ITU-T Recommendation G.975.1, and putting an inner code adjacent thereto, a frame format is as illustrated in FIG. 8.

It should be noted that the frame generation circuit 32 is necessary when consideration is given to the frame format, such as the OTUkV frame, but the frame generation circuit 32 is not always necessary in a digital transmission system which is capable of continuous encoding and thus does not require particular consideration about the frame format.

Referring back to FIG. 1, next, the outer encoding circuit 33 performs outer encoding processing (encoding processing for outer code). The outer-encoding input circuit 51 performs input timing adjustment, input sequence order adjustment (including interleaving processing), and the like with respect to the frame sequence which is input from the frame generation circuit 32. The outer-encoding operation circuit 52 performs an outer encoding operation. The outer-encoding output circuit 53 performs output timing adjustment, output sequence order adjustment (including interleaving processing), scrambling processing, and the like, and then outputs a result thereof as an outer-encoding output sequence (parallel).

It should be noted that, as a scheme for the outer encoding operation performed by the outer-encoding operation circuit 52, hard-decision decoding is suitable, and a block code, such as a Bose-Chaudhuri-Hocquenghem (BCH) code or a Reed-Solomon (RS) code, in particular, is suitable because such a block code allows a circuit size to be made relatively smaller. Further, a concatenated code, a product code, or the like, which has a higher error correction capability than a single block code, may be used. In particular, as has been described with reference to FIG. 8, a configuration example is preferably as follows. That is, there is used a concatenated code, a product code, or the like compliant with the OTUk frame, such as a code described in Appendix of ITU-T Recommendation G.975.1 (combination of a plurality of kinds of block codes, such as a BCH code and an RS code). Further, a combination of a block code and a convolutional code may be used.

Further, the timing adjustment, the sequence order adjustment, and the like, which are performed by the outer-encoding input circuit 51 and the outer-encoding output circuit 53, vary depending on the type of an outer code to be employed, the presence/absence of interleaving and the configuration thereof, the presence/absence of scrambling and the type thereof, etc. However, any configuration may be used to realize the first embodiment of the present invention. Further, an output from the outer-encoding output circuit 53 is configured in a normal form of n parallel bus signals. However, the output may be subjected to conversion so as to be compliant with a predetermined interface standard, such as SFI. In this case, the outer encoding circuit 33 and the inner encoding circuit 34 may be installed in different devices.

Referring back to FIG. 1, next, the inner encoding circuit 34 performs inner encoding processing (encoding processing for inner code). Hereinafter, description is given of the inner encoding processing with reference to FIG. 3. The inner-encoding input I/F circuit 71 performs input timing adjustment, de-scrambling processing, and the like with respect to the outer-encoding output sequence (parallel) which is input from the outer encoding circuit 33. In the case where the outer-encoding output circuit 53 performs the conversion into the predetermined interface standard, such as SFI, before performing the output, the inner-encoding input I/F circuit 71 also performs inverse conversion therefor. The inner-encoding input I/F circuit 71 outputs a processing result in the form of N parallel signals. The parallel number N may be defined with an arbitrary integer according to a predetermined frame format. However, in the first embodiment of the present invention, description is given by assuming that N=512 in consideration of the case of using a frame compliant with the OTUkV frame. Through the processing described above, the N parallel signals are output to the 1-1 interleaving circuit 72.

Based on the predetermined frame format, the 1-1 interleaving circuit 72 and the 1-2 interleaving circuit 73 perform sorting processing on the sequence, and then outputs a resultant inner-encoding input sequence to the inner-encoding operation circuit 55. A specific scheme for this sorting is described later.

The inner-encoding operation circuit 55 performs an inner encoding operation with respect to the inner-encoding input sequence, and then outputs a resultant inner-encoding output sequence to the inner-encoding output circuit 56. It should be noted that, as a scheme for the inner encoding operation, the following may be applicable. Those are a block code, such as a BCH code or an RS code, a convolutional code, a convolutional turbo code, a block turbo code, a low-density parity-check (LDPC) code, and the like. Here, a suitable inner code is such a code that is soft-decision decodable and has a higher error correction capability. In particular, in the first embodiment of the present invention, description is given by assuming that the LDPC code is used.

In the inner-encoding output circuit 56, first, the 1-2 de-interleaving circuit 74 and the 1-1 de-interleaving circuit 75 perform sorting-back processing with respect to the inner-encoding output sequence, and then, a result thereof is transferred to the inner-encoding output I/F circuit 76. A specific scheme for this sorting-back is described later. It should be noted that this description is based on the assumption that the sorting-back processing is performed, but the sorting-back processing does not necessarily need to be performed depending on a condition of the predetermined frame format. Further, instead of the sorting-back processing, there may be performed sorting processing to obtain an order different from that when the sequence is input to the inner encoding circuit 34.

The inner-encoding output I/F circuit 76 performs output timing adjustment, scrambling processing, and the like, and then outputs a result thereof as a codeword sequence (parallel). Further, an output from the inner-encoding output circuit 56 is configured in a normal form of N parallel bus signals. However, the output may be subjected to conversion so as to be compliant with a predetermined interface standard, such as SFI. In this case, the inner encoding circuit 34 and the transmission-side multiplexing circuit 35 may be installed in different devices.

Lastly, the transmission-side multiplexing circuit 35 performs multiplexing conversion with respect to the codeword sequence (parallel) to generate a codeword sequence (serial), and then outputs the codeword sequence to the D/A converter 12.

It should be noted that information (data), which is to be transmitted between the circuits 31 and 35 of the error correction encoder 11, and further inside, between the circuits 51 and 56, 71 and 73, and 74 and 76, may be transferred by pipelining via buses connecting the circuits. Alternatively, a working storage area, which can be accessed by adjacent circuits located downstream and upstream of the circuit, may be provided to transfer information. Further, a particular section, for example, a section between the outer encoding circuit 33 and the inner encoding circuit 34, may be connected using a predetermined interface standard, such as SFI.

Description is given of an operation of the error correction decoder 23. It should be noted that the error correction decoder 23 has a circuit configuration corresponding to the error correction encoder 11, and has a function of decoding an error correction code obtained through the encoding by the error correction encoder 11.

In FIG. 2, first, the frame synchronization circuit 41 adjusts the synchronization timing of a predetermined frame of a quantized reception sequence (serial) which is input to the error correction decoder 23, and then, the quantized reception sequence is input to the reception-side demultiplexing circuit 42.

It should be noted that the frame synchronization circuit 41 is necessary to detect an OH added to the quantized reception sequence and locate a head position of the frame when consideration is given to the frame format, such as the OTUk frame or the OTUkV frame, but the frame synchronization circuit 41 is not always necessary in a digital transmission system which is capable of continuous encoding and thus does not require particular consideration about the frame format.

The reception-side demultiplexing circuit 42 converts the quantized reception sequence (serial) into a sequence in parallel order. The quantized reception sequence (parallel) obtained through the conversion is output to the inner decoding circuit 43. A parallel number in this case is defined as "N". The parallel number N may be defined with an arbitrary integer according to the predetermined frame format, but it is desired that the parallel number N be set to correspond to the transmission side. Thus, in the first embodiment of the present invention, description is given by assuming that N=512 to correspond to the transmission side.

Here, with regard to the quantized reception sequence obtained through the processing by the A/D converter 22, assuming that one transmission symbol is quantized into q bits, a case where q=1 is referred to as "hard decision", whereas a case where q>1 is referred to as "soft decision". In the first embodiment of the present invention, the case of the soft decision is assumed. Because q bits per one transmission symbol is regarded as one symbol and the one symbol is processed in a batched manner, description is given by assuming that the defined parallel number N corresponds to N parallel symbols for the sake of convenience.

Next, the inner decoding circuit 43 performs inner decoding processing (decoding of inner code). Hereinafter, description is given of the inner decoding processing with reference to FIG. 4. The inner-decoding input I/F circuit 81 performs input timing adjustment, de-scrambling processing, and the like with respect to the quantized reception sequence (parallel) which is input from the reception-side demultiplexing circuit 42. In the case where the reception-side demultiplexing circuit 42 performs conversion into a predetermined interface standard, such as SFI, before performing the output, the inner-decoding input I/F circuit 81 also performs inverse conversion therefor. The inner-decoding input I/F circuit 81 outputs a processing result in the form of N parallel signals.

The soft-input value operation circuit 82 converts the quantized reception sequence (parallel) having q bits per one transmission symbol into soft-input values (parallel) having Q bits per one transmission symbol. This conversion processing is necessary in the case where a code suitable for the soft-decision decoding is selected, such as a convolutional code, a convolutional turbo code, a block turbo code, or an LDPC code. The conversion processing is unnecessary in the case of the hard-decision decoding. Further, in a case where it is possible to directly process the quantized reception sequence (parallel) having q bits per one transmission symbol as soft-input values (parallel), the conversion processing is unnecessary as well. A specific processing scheme varies depending on a code to be employed, a communication channel model, and the like. The first embodiment of the present invention is applicable to any scheme.

Based on the predetermined frame format, the 2-1 interleaving circuit 83 and the 2-2 interleaving circuit 84 perform sorting processing on the sequence, and then, a resultant inner-decoding input sequence is output to the inner-decoding operation circuit 62. A specific scheme for this sorting is described later. It should be noted that the sorting is performed in the order that corresponds to the order of the sorting performed by the 1-2 de-interleaving circuit 74 and the 1-1 de-interleaving circuit 75 on the transmission side. Accordingly, for example, in a case where the sorting-back processing is not performed on the transmission side or in a case where the sorting-back processing is different, it is necessary to adjust the order of the sorting according thereto.

The inner-decoding operation circuit 62 performs an inner decoding operation with respect to the inner-decoding input sequence, and then outputs a resultant inner-decoding output sequence to the inner-decoding output circuit 63. This processing for inner decoding is performed according to the scheme for inner encoding. In a case where a block code, such as a BCH code or an RS code, is selected, the hard-decision decoding is preferably performed. In a case where a convolutional code is selected, the soft-decision decoding is preferably performed. In a case where a convolutional turbo code, a block turbo code, an LDPC code, or the like is used, soft-decision iterative decoding is preferably performed. In the first embodiment of the present invention, in particular, description is given by assuming that the soft-decision iterative decoding is used for the LDPC code.

In the inner-decoding output circuit 63, first, the 2-2 de-interleaving circuit 85 and the 2-1 de-interleaving circuit 86 perform sorting-back processing with respect to the inner-decoding output sequence, and transfers a result thereof to the inner-decoding output I/F circuit 87. A specific scheme for this sorting-back is described later. It should be noted that this description is based on the assumption that the sorting-back processing is performed, but the sorting-back processing does not necessarily need to be performed depending on a condition of the predetermined frame format. The sorting-back processing may be performed according to the sorting processing on the transmission side so that the sequence is eventually returned to the order when the sequence is input to the 1-1 interleaving circuit 72.

The inner-decoding output I/F circuit 87 performs output timing adjustment, scrambling processing, and the like, and then outputs a result thereof as an inner-decoding output sequence (parallel). Further, an output from the inner-decoding output circuit 63 is configured in a normal form of n parallel bus signals corresponding to the transmission side. However, the output may be subjected to conversion so as to be compliant with a predetermined interface standard, such as SFI. In this case, the inner decoding circuit 43 and the outer decoding circuit 44 may be installed in different devices.

Referring back to FIG. 2, next, the outer decoding circuit 44 performs outer decoding processing (decoding of outer code). The outer-decoding input circuit 64 performs input timing adjustment, input sequence order adjustment (including interleaving processing), de-scrambling processing, and the like with respect to the inner-decoding output sequence (parallel) which is input from the inner decoding circuit 43. The outer-decoding operation circuit 65 performs an outer decoding operation. The outer-decoding output circuit 66 performs output timing adjustment, output sequence order adjustment (including interleaving processing), and the like, and then outputs a result thereof as an estimated codeword sequence (parallel).

It should be noted that in a case where a block code suitable for the hard-decision decoding, such as a BCH code or an RS code, in particular, is selected as a scheme for outer encoding, hard-decision bounded-distance decoding corresponding to the outer encoding is performed in the outer decoding processing performed by the outer-decoding operation circuit 65. Further, in a case where a concatenated code, a product code, or the like is used as a scheme for outer encoding, it is desired that the hard-decision iterative decoding be performed in the outer-decoding operation circuit 65.

It should be noted that soft-decision information (Q' bits per transmission symbol, Q'>1) may be output as an inner decoding result, to thereby perform the soft-decision iterative decoding with the outer code. Further, an erasure flag (flag indicating "1" in the case of erasure of one transmission symbol, and otherwise "0") may be additionally output as an inner decoding result, and decoding based on erasure correction may be performed with the outer code. It should be noted that the outer decoding processing is preferably performed through the hard-decision decoding based on hard-decision information (Q'=1).

Further, the timing adjustment, the sequence order adjustment, and the like, which are performed by the outer-decoding input circuit 64 and the outer-decoding output circuit 66, vary depending on the type of an outer code to be employed, the presence/absence of interleaving and the configuration thereof, the presence/absence of scrambling and the type thereof, etc. However, any configuration may be used to realize the first embodiment of the present invention. Further, an input to the outer-decoding input circuit 64 is configured in a normal form of n parallel bus signals. However, the input may be subjected to conversion so as to be compliant with a predetermined interface standard, such as SFI. In this case, the inner decoding circuit 43 and the outer decoding circuit 44 may be installed in different devices.

The frame separation circuit 45 (corresponding to the frame generation circuit 32 on the transmission side) removes bits corresponding to an overhead (OH) signal and bits corresponding to a parity sequence from the estimated codeword sequence, and then outputs an estimated information sequence (parallel). Then, lastly, the reception-side multiplexing circuit 46 performs multiplexing conversion with respect to the estimated information sequence (parallel) to generate an estimated information sequence (serial), and then outputs the estimated information sequence in serial order or in a form compliant with a predetermined interface standard, such as SFI.

It should be noted that the frame separation circuit 45 is necessary when consideration is given to the frame format, such as the OTUk frame or the OTUkV frame, but the frame separation circuit 45 is not always necessary in a digital transmission system which is capable of continuous encoding and thus does not require particular consideration about the frame format.

It should be noted that information (data), which is to be transmitted between the circuits 41 and 46 of the error correction decoder 23, and further inside, between the circuits 61 and 66, 81 and 84, and 85 and 87, may be transferred by pipelining via buses connecting the circuits. Alternatively, a working storage area, which can be referenced by adjacent circuits located downstream and upstream of the circuit, may be provided to transfer information. Further, a particular section, for example, a section between the inner decoding circuit 43 and the outer decoding circuit 44, may be connected using a predetermined interface standard, such as SFI.

Here, description is given of the interleaving processing and the de-interleaving processing, which are performed in the inner encoding circuit 34 and the inner decoding circuit 43.

Figure 9:
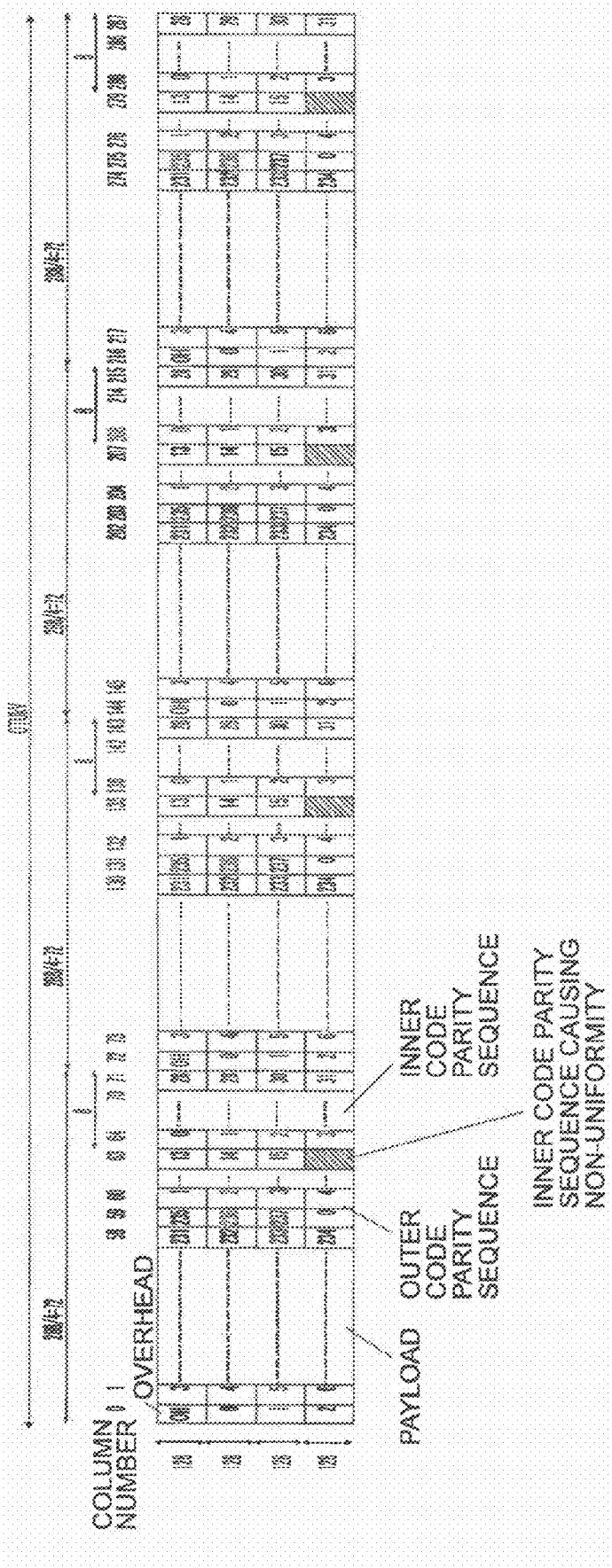
FIG. 9 is an explanatory diagram illustrating a frame format used in the error correction encoding method according to the first embodiment of the present invention.

FIG. 9 illustrates the OTUkV frame of FIG. 7 or FIG. 8 by means of an image view of an internal data bus having N (N=512) parallel lines. In FIG. 9, the topmost bit located at a column number "0" at upper left is a bit to be transmitted first, and bits are arranged downward therefrom in order of transmission. Bits after the 512th bit are sequentially arranged downward from the top at the next column number "1" in order. Because the length of each Row of the OTUk frame is 4,080 bytes, the length of the Row 1 extends up to the 384th bit at a column number "63" in the case of 512 parallel lines. The length of the parity sequence of the OTUkV frame may be arbitrarily set, but, in the description of the first embodiment of the present invention, the length of the parity sequence is set as 256 bytes (parity sequence of OTUk frame)+528 bytes. In this case, the lower 128 bits at the column number "63" and the bits at column numbers "64" to "71" are occupied by the inner code parity sequence. The Row 2 and the subsequent Rows are arranged in order from the topmost bit at a column number "72", and, eventually, one OTUkV frame occupies 512 (parallel lines)×288 (columns) bits.

Here, the problem is the areas of inner code parity sequences, which are indicated by black blocks at the 63rd column, the 135th column, the 207th column, and the 279th column, and which cause non-uniformity. Those areas (128 (bits)×4 (columns)) occur due to constraint conditions imposed by the frame length of the OTUk frame and the parallel number N (=512). In the case of using an LDPC code as the inner code, it is not practical to allocate only one codeword of the LDPC code to the OTUkV frame in consideration of the circuit size, and thus a plurality of codewords need to be allocated to the OTUkV frame. Specifically, the areas of the overhead, the payload, and the outer code parity sequence need to be allocated to an information sequence having a plurality of LDPC codewords, and also, the area of the inner code parity sequence indicated in black and thick gray needs to be allocated to a parity sequence having a plurality of LDPC codewords. For example, in a case where, as an allocation scheme, those areas are divided into different codewords on a line basis, allocation ratios between the information sequence area and the parity sequence area become non-uniform between the upper 384 lines and the lower 128 lines.

As one solution scheme therefor, it is conceivable to allocate LDPC codes having different information lengths and parity lengths between the upper side and the lower side. However, in this case, two kinds of inner encoders and inner decoders need to be mounted, respectively, and hence this solution is not an efficient scheme.

In view of the above, in the first embodiment of the present invention, interleaving is carried out, in which a parallel input sequence is divided into given L lanes, and a given barrel shift is performed for each inner frame. With this configuration, the allocation ratios between the information sequence area and the parity sequence area are made uniform.

First, the parallel input sequence having the parallel number N=512 is divided into given lanes. Here, one lane is set for each 128 bits, and there is provided a configuration having a total of L (=4) lanes. Incidentally, the 4-lane configuration has a good compatibility with a modulation scheme combining a multi-level modulation, such as quadrature phase shift keying (QPSK), and polarization multiplexing of a polarization channel (x-polarized wave and y-polarized wave), which has been becoming mainstream in optical communications in recent years. It should be noted that the lane number L may be defined with an arbitrary integer according to the predetermined frame format, and that the first embodiment of the present invention may be realized with any number.

Figure 10:
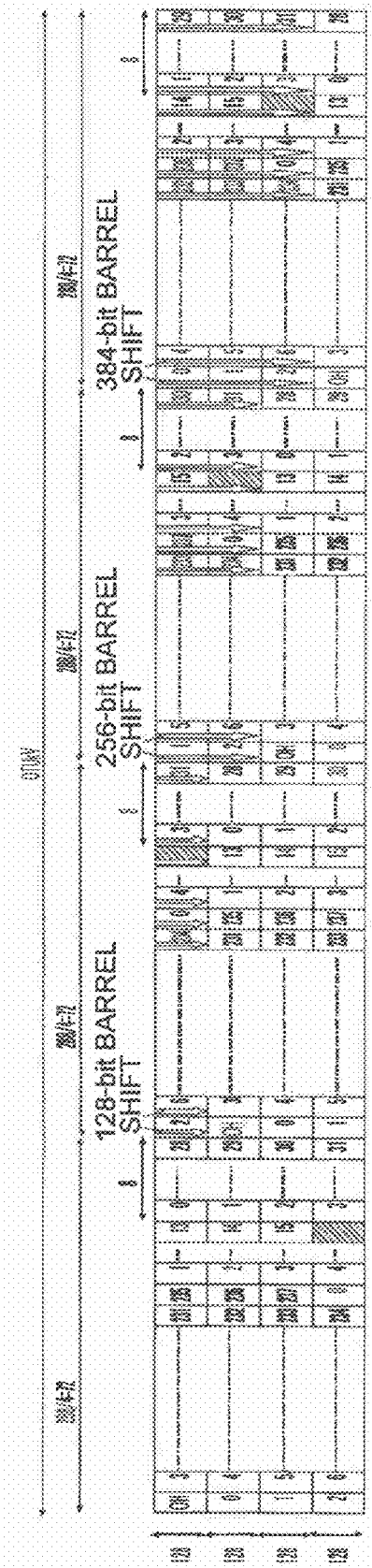
FIG. 10 is an explanatory diagram illustrating a frame format used in the error correction encoding method according to the first embodiment of the present invention.

Next, processing of interchanging lanes on a column basis is performed. As a scheme for this interchanging on a column basis, various schemes may be employed. For example, it is conceivable to perform the sorting by means of the barrel shift in units of lanes (units of 128 bits) for each column. Further, it is conceivable to vary a shift amount of the barrel shift for each of four FEC frames contained in one OTUkV frame. FIG. 10 is an example thereof, and illustrates a state obtained after the sorting is performed through the barrel shift. Here, a barrel shift amount for each column of the first FEC frame contained in the OTUkV frame is set to 0 bits. The barrel shift amount for each column of the second FEC frame is set to 128 bits downward. The barrel shift amount for each column of the third FEC frame is set to 256 bits downward. The barrel shift amount for each column of the last FEC frame is set to 384 bits downward. As is apparent from FIG. 10, one black block appears in each lane. Therefore, the allocation ratios between the information sequence area and the parity sequence area can be made uniform among the lines.

Figure 11:
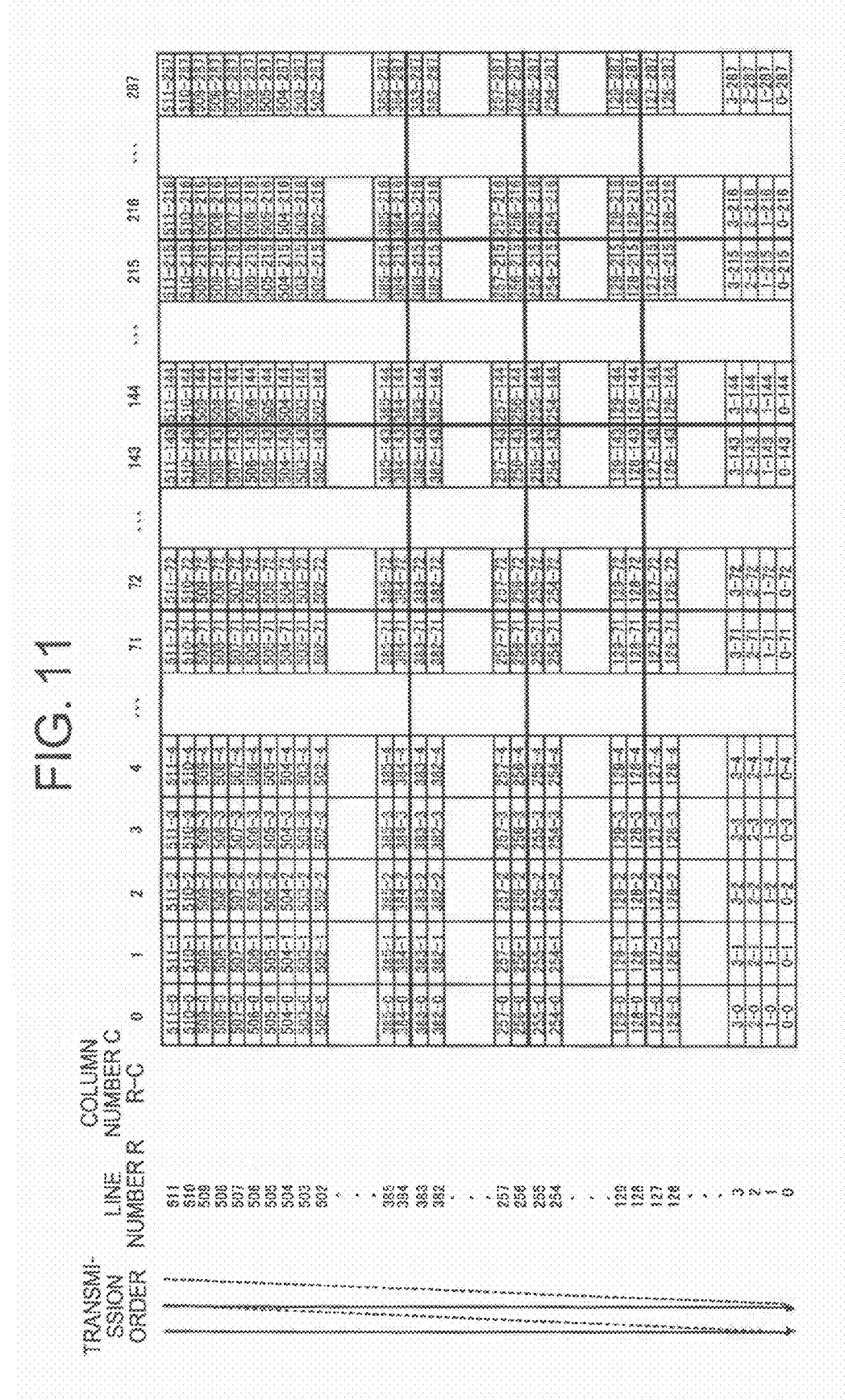
Figure 12:
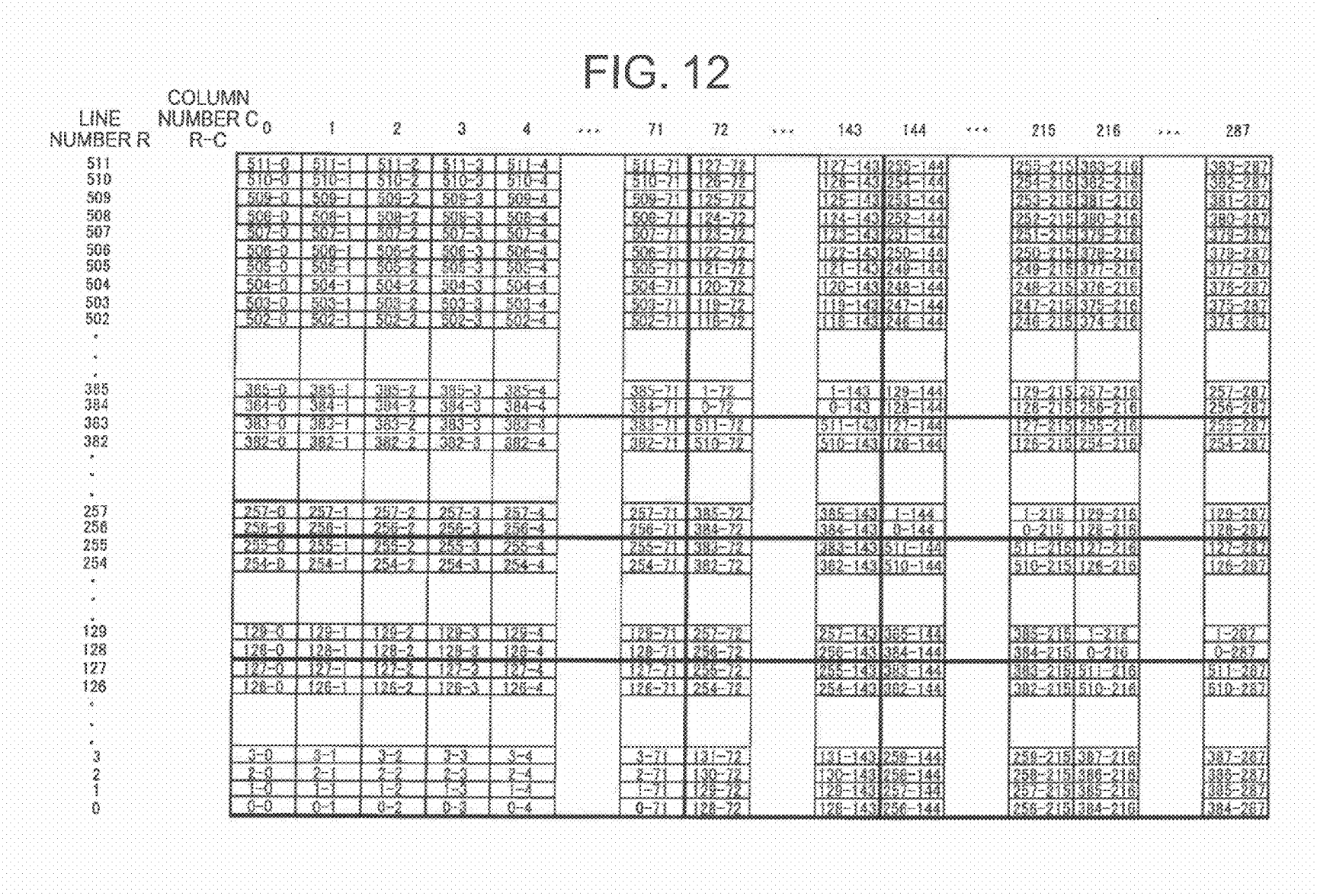

FIG. 11 is a diagram illustrating an outer-encoding output sequence (parallel) before the order is changed by the 1-1 interleaving circuit 72. In FIG. 11, such numbers as "511-0" and "510-1", which are indicated in forms of "R-C", are numbers each indicating a location of each bit of the OTUk frame, where "R" represents the line number (the top is "511"), and "C" represents the column number (the left is "0"). The 1-1 interleaving circuit 72 does not change the order obtained when the outer-encoding output sequence (parallel) from the N (=512) parallel lines is input (corresponding to each column). However, every time the outer-encoding output sequence is input from the N parallel lines, the column is closed and the order therein is changed. As a scheme for this changing on a column basis, various schemes may be employed. In the first embodiment of the present invention, there is provided an example in which the sorting using the barrel shift is performed in units of lanes (units of 128 bits) for each column. FIG. 12 is a diagram illustrating sequence arrangement of the OTUk frame obtained after the order is changed as described above.

Next, an allocation scheme for codewords of the LDPC code is determined. For this allocation scheme, various schemes may be employed according to the predetermined frame format. Here, there is assumed a scheme in which different codewords are allocated to a codeword sequence of the LDPC code on a line basis.

Figure 13:
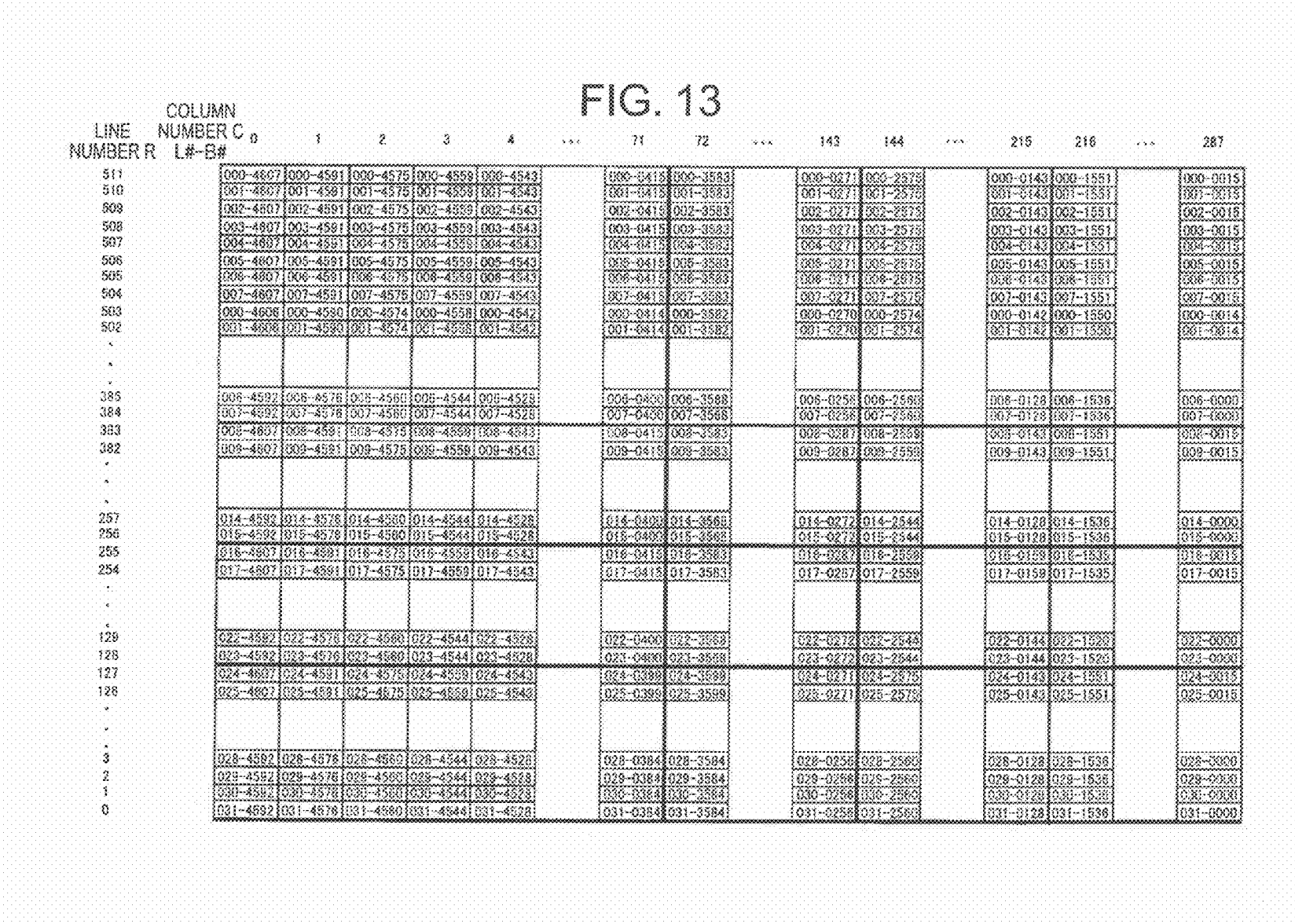

FIG. 13 is a diagram illustrating the order changing that is performed in the 1-2 interleaving circuit 73. In FIG. 13, such numbers as "000-4607" and "001-4591", which are indicated in forms of "L#-B#", are numbers each indicating a codeword number of the LDPC code and a bit location of each codeword, where "L#" represents the codeword number (the first codeword is "000"), and "B#" represents the bit number (the first bit is "4607"). Here, there is assumed a case in which 32 codewords (8 codewords for each lane) of the LDPC code are allocated for each OTUkV frame. Bits of line numbers "511" to "504" at the column number "0" are allocated to different codewords L# (=000 to 007), respectively, and those bits are distributed as the first bits B# (=4607) of the codewords, respectively. Further, bits of line numbers "503" to "496" at the column number "0" are distributed as bits B# (=4606) of the codewords L# (=000 to 007), respectively. Further, different codewords are allocated from lane to lane. According to this procedure, identical codewords contained in each column are 16 bits. One OTUkV frame is structured to have 288 columns, and hence a code length of the LDPC code is 4,608 bits. Further, in this example, an information sequence length is 4,080 bits, and a parity sequence length is 528 bits.

Figure 14:
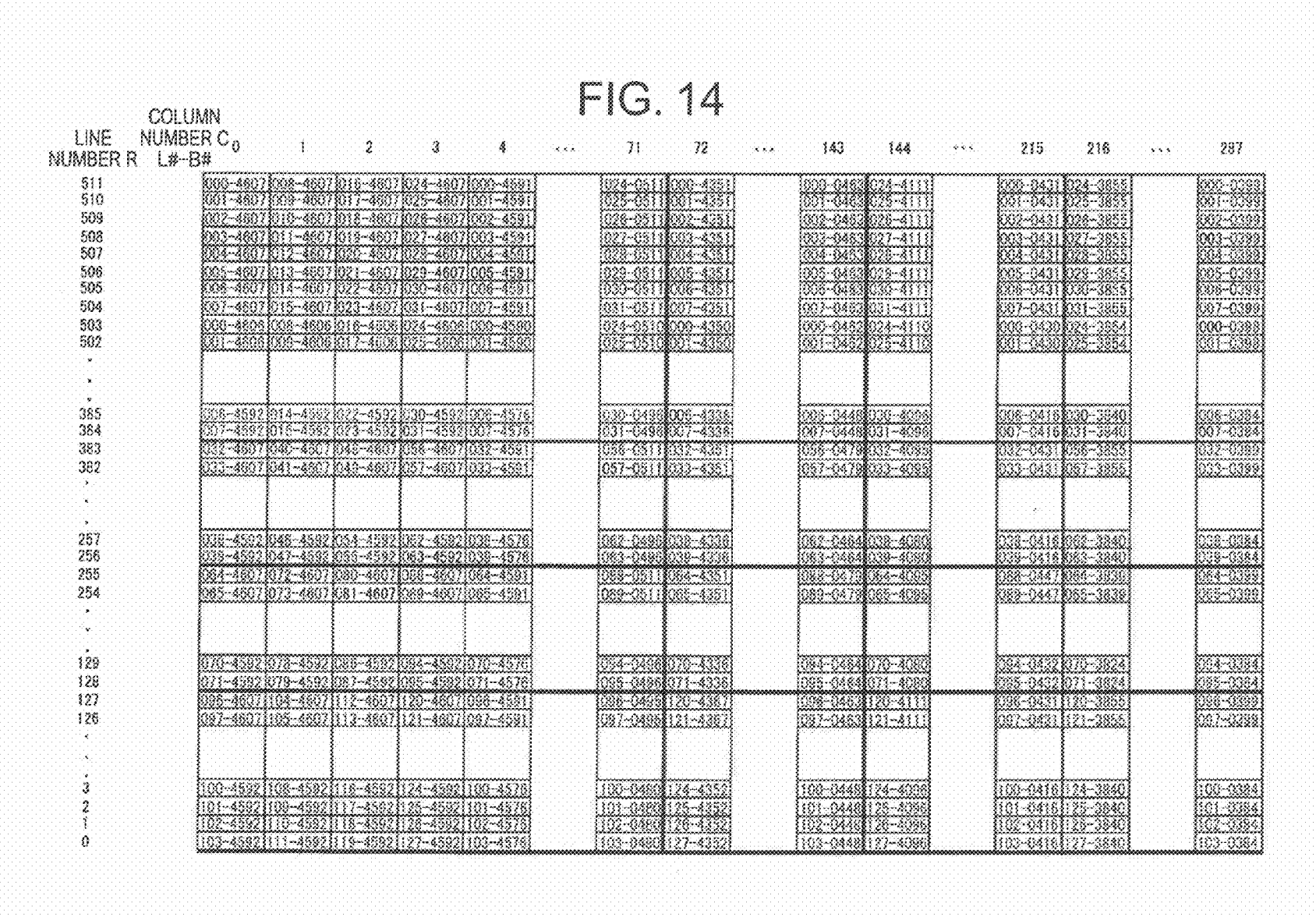

One merit of the first embodiment of the present invention is that an interleaving depth may be expanded easily. In the paragraphs described above, the interleaving depth is set to one OTUkV frame. However, the interleaving depth may be set to two OTUkV frames or four OTUkV frames. FIG. 14 is a diagram illustrating the order changing that is performed in the 1-2 interleaving circuit 73 in a case where the interleaving depth is set to four OTUkV frames. When it is assumed that parameters of the LDPC code are the same as in the paragraphs described above, 128 codewords need to be distributed within the four OTUkV frames. Regarding a distribution scheme therefor, as illustrated in FIG. 14, the following procedure is performed. That is, different codewords are allocated among adjacent columns having column numbers "0", "1", "2", and "3". Then, the column number "0" and a column number "4" in the same line are allocated to the same codeword, and the column number "1" and a column number "5" in the same line are allocated to the same codeword. In other words, it is possible to deepen the interleaving depth without significantly changing the rule for allocating individual codewords. It should be noted that FIG. 14 illustrates the first OTUkV frame of the four OTUkV frames, and that the same distribution as described above is applied to the second and subsequent OTUkV frames.

It should be noted that in the case where the interleaving depth is set to four OTUkV frames, the sorting in the 1-1 interleaving circuit 72 may be performed using a scheme of setting a different barrel shift amount for each OTUkV frame, apart from the scheme of setting a different barrel shift amount for each FEC frame.

The 1-2 de-interleaving circuit 74 performs processing of returning the order of the inner-encoding output sequence, that is, the order of the LDPC codeword sequence, to the sequence order obtained when the inner-encoding output sequence is input to the 1-2 interleaving circuit 73. Further, the 1-1 de-interleaving circuit 75 performs processing of returning the sequence to the sequence order obtained when the sequence is input to the 1-1 interleaving circuit 72 by performing an operation of reversing a barrel shift operation performed in the 1-1 interleaving circuit 72. It should be noted that this description is based on the assumption that the sorting-back processing is performed, but the sorting-back processing does not necessarily need to be performed depending on a condition of the predetermined frame format. Further, instead of the sorting-back processing, there may be performed sorting processing to obtain an order different from that when the frame sequence is input to the inner encoding circuit 34.

The 2-1 interleaving circuit 83 performs the same operation as the barrel shift operation performed in the 1-1 interleaving circuit 72 with respect to the quantized reception sequence (parallel). The 2-2 interleaving circuit 84 performs the same operation as an operation of LDPC codeword sequence allocation performed in the 1-2 interleaving circuit 73, and then outputs the inner-decoding input sequence, that is, a soft-input sequence on an LDPC codeword basis. It should be noted that the sorting is performed in the order that corresponds to the order of the sorting performed by the 1-2 de-interleaving circuit 74 and the 1-1 de-interleaving circuit 75 on the transmission side. Accordingly, for example, in the case where the sorting-back processing is not performed on the transmission side or in the case where the sorting-back processing is different, it is necessary to adjust the order of the sorting according thereto.

The 2-2 de-interleaving circuit 85 performs processing of returning the order of the inner-decoding output sequence, that is, the order of an LDPC estimated codeword sequence, to the sequence order obtained when the inner-decoding output sequence is input to the 2-2 interleaving circuit 84. Further, the 2-1 de-interleaving circuit 86 performs processing of returning the sequence to the sequence order obtained when the sequence is input to the 2-1 interleaving circuit 83 by performing an operation of reversing the barrel shift operation performed in the 2-1 interleaving circuit 83. It should be noted that this description is based on the assumption that the sorting-back processing is performed, but the sorting-back processing does not necessarily need to be performed depending on a condition of the predetermined frame format. The sorting-back processing may be performed according to the sorting processing on the transmission side so that the sequence is eventually returned to the order when the sequence is input to the 1-1 interleaving circuit 72.

It should be noted that the embodiment described above is not limited to the parameters described in the specific example, and, as is obvious, as long as it is possible to appropriately combine the scheme for error correction encoding, the length of the frame format, the parallel number for input/output, the transmission speed, etc., any combination may be used to realize the embodiment.

Further, the present invention is not limited to optical transmission systems for its application, and is applicable to various kinds of transmission systems, such as subscriber wire communications, mobile wireless communications, and satellite communications.

Further, in the embodiment described above, there has been given an example in which the encoding processing for inner code is performed after the encoding processing for outer code is performed in the error correction encoder 11, but the present invention is not limited to this case. After the encoding processing for inner code is performed, the encoding processing for outer code may be performed. Further, similarly, in the embodiment described above, there has been given an example in which the decoding processing for outer code is performed after the decoding processing for inner code is performed, but the present invention is not limited to this case. After the decoding processing for outer code is performed, the decoding processing for inner code may be performed.

As described above, according to the first embodiment of the present invention, there are provided the outer encoding circuit 33, the inner encoding circuit 34, the inner decoding circuit 43, the outer decoding circuit 44, the input circuits and output circuits having the interleaving function of performing the given barrel shift, and the input circuits and output circuits having the de-interleaving function of performing the given barrel shift. Such a configuration enables the allocation ratios between the information sequence area and the parity sequence area to be made uniform, and hence it is possible to improve a processing throughput and enhance an error correction capability through avoiding a constraint imposed on the frame structure.

What is claimed is:

1. An error correction encoding method, comprising:
   an outer encoding step of performing encoding processing for an outer code of a parallel input sequence;
   an inner encoding step of performing encoding processing for an inner code of the parallel input sequence; and
   an interleaving processing step of dividing the encoded parallel input sequence into lanes of a predetermined byte length greater than one, and performing a barrel shift based on an integer multiple of the predetermined byte length for each of a plurality of inner frames in the lanes, the integer multiple being greater than zero for at least one of the plurality of inner frames.

2. The error correction encoding method according to claim 1, wherein the interleaving processing step comprises processing a plurality of frames in the parallel input sequence as one unit.

3. The error correction encoding method according to claim 2, wherein the interleaving processing step comprises a scheme of switching an order of the barrel shift on a frame basis, and a scheme of switching the order of the barrel shift on an inner frame basis.

4. An error correction decoding method, comprising:
   an outer decoding step of performing decoding processing for an outer code of a parallel input sequence;
   an inner decoding step of performing decoding processing for an inner code of the parallel input sequence; and
   an interleaving processing step of dividing the decoded parallel input sequence into lanes of a predetermined byte length greater than one, and performing a barrel shift based on an integer multiple of the predetermined byte length for each of a plurality of inner frames in the lanes, the integer multiple being greater than zero for at least one of the plurality of inner frames.

5. The error correction decoding method according to claim 4, wherein the interleaving processing step comprises processing a plurality of frames of the parallel input sequence as one unit.

6. The error correction decoding method according to claim 5, wherein the interleaving processing step comprises a scheme of switching an order of the barrel shift on a frame basis, and a scheme of switching the order of the barrel shift on an inner frame basis.

7. An error correction encoding device, comprising:
   an outer encoding circuit that performs encoding processing for an outer code of a parallel input sequence;
   an inner encoding circuit that performs encoding processing for an inner code of the parallel input sequence; and
   an interleaving circuit that divides the encoded parallel input sequence into lanes of a predetermined byte length greater than one, and performs a barrel shift based on an integer multiple of the predetermined byte length for each of a plurality of inner frames in the lanes, the integer multiple being greater than zero for at least one of the plurality of inner frames.

8. An error correction decoding device, comprising:
   an outer decoding circuit that performs decoding processing for an outer code of a parallel input sequence;
   an inner decoding circuit that performs decoding processing for an inner code of the parallel input sequence; and
   an interleaving circuit that divides the decoded parallel input sequence into lanes of a predetermined byte length greater than one, and performs a barrel shift based on an integer multiple of the predetermined byte length for each of a plurality of inner frames in the lanes, the integer multiple being greater than zero for at least one of the plurality of inner frames.

9. The error correction encoding method according to claim 1, wherein the predetermined byte length is 16 bytes.

10. The error correction encoding method according to claim 1, wherein the integer multiple of the predetermined byte length is different for each of the plurality of inner frames in the lanes.

* * * * *